(12) United States Patent
Noro

(10) Patent No.: US 7,312,104 B2
(45) Date of Patent: Dec. 25, 2007

(54) RESIN COMPOSITION FOR ENCAPSULATING SEMICONDUCTOR DEVICE

(75) Inventor: Hiroshi Noro, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 299 days.

(21) Appl. No.: 10/941,883

(22) Filed: Sep. 16, 2004

(65) Prior Publication Data

US 2005/0064201 A1    Mar. 24, 2005

(30) Foreign Application Priority Data

Sep. 18, 2003    (JP) .............................. 2003-326907

(51) Int. Cl.
*H01L 23/00* (2006.01)
*B32B 27/20* (2006.01)
*B32B 27/38* (2006.01)
*C08L 63/00* (2006.01)

(52) U.S. Cl. ...................... 438/108; 428/413; 428/414; 428/416; 523/440; 523/443; 523/457; 523/458; 523/466

(58) Field of Classification Search ...................... None
See application file for complete search history.

(56) References Cited

U.S. PATENT DOCUMENTS

| 5,175,199 | A * | 12/1992 | Asano et al. ................. 523/444 |
| 7,109,591 | B2 * | 9/2006 | Hack et al. ................... 257/788 |
| 2002/0058145 | A1 * | 5/2002 | Kanamaru et al. ........... 428/413 |

2002/0058742 A1    5/2002 Honda et al.

FOREIGN PATENT DOCUMENTS

| JP | 6-65475 A | 3/1994 |
| JP | 11-74424 A | 3/1999 |
| JP | 2001-144120 A | 5/2001 |
| JP | 2002-088222 | * 3/2002 |
| JP | 2002-118147 A | 4/2002 |
| JP | 2003-138100 A | 5/2003 |

OTHER PUBLICATIONS

Machine translation of JP 2002-118147.*
Machine translation of JP 06-065475.*
Machine translation of JP 11-074424.*

* cited by examiner

*Primary Examiner*—Michael J. Feely
(74) *Attorney, Agent, or Firm*—Birch, Stewart, Kolasch & Birch, LLP

(57) ABSTRACT

A resin composition usable for encapsulating a semiconductor, comprising (A) an epoxy resin having two or more epoxy groups in one molecule; (B) a curing agent; and (C) inorganic composite oxide particles constituted by silicon dioxide and at least one metal oxide selected from the group consisting of oxides of metal atoms belonging to Group III and Group IV of the Periodic Table excluding silicon; a semiconductor device comprising a wiring circuit board, a semiconductor element, and the above resin composition; and a method for manufacturing a semiconductor device comprising the steps of adhering a resin sheet comprising the resin composition of claim 1 and a stripping sheet to a semiconductor circuit side of a bump-mounting wafer, removing the stripping sheet leaving only the resin composition to the wafer, and cutting the wafer into individual chips.

11 Claims, 2 Drawing Sheets

RESIN COMPOSITION FOR ENCAPSULATING SEMICONDUCTOR DEVICE

This Non-provisional application claims priority under 35 U.S.C. § 119(a) on Patent Application No(s). 2003-326907 filed in Japan on Sep. 18, 2003, the entire contents of which are hereby incorporated by reference.

BACKGROUND OF THE INVENTION

1. Field of the Invention

The present invention relates to a resin composition usable for encapsulating a semiconductor device for the purpose of encapsulating a gap formed between the wiring circuit board and the semiconductor element (hereinafter simply referred to as "resin composition"), and a semiconductor device in which the resin encapsulation is carried out with the resin composition for encapsulating a semiconductor device.

2. Discussion of the Related Art

As the recent requirements accompanied by multi-functionality and miniaturization of a semiconductor device, a flip-chip mounting in which a semiconductor element is mounted on a wiring circuit board with a facedown structure has been carried out. Generally, in the flip-chip mounting, a gap between a semiconductor element and a wiring circuit board is encapsulated with a thermosetting resin composition in order to protect the semiconductor element.

A conventional manufacturing method with the flip-chip mounting comprises the step of creating patterns on a wafer, forming bumps, cutting the wafer into individual semiconductor elements, mounting the semiconductor elements on a wiring circuit board, and carrying out resin encapsulation. On the other hand, in order to improve the productivity of semiconductor devices, there has been desired a method comprising the steps of creating patterns on a wafer, forming bumps, feeding an adhesive (resin composition) to a patterned side, cutting the wafer into individual semiconductor elements, and mounting the semiconductor element on a wiring circuit board in a face-down structure (hereinafter referred to as wafer level flip-chip mounting method) (see, for instance, Japanese Patent Laid-Open No. 2001-144120). In the wafer level flip chip mounting method mentioned above, since a thermosetting resin composition is fed to a patterned side, the wafer is cut into individual semiconductor elements, and the semiconductor elements obtained are mounted in a circuit substrate, it is necessary that the thermosetting resin composition retains a pattern-recognizable transmittance. On the other hand, in the thermosetting resin composition for encapsulating a connecting portion of the flip chip package, generally, thermal expansion coefficient or water absorption is lowered by containing an inorganic filler in an organic resin composition, thereby satisfying thermal cycle test performance and solder resistance of semiconductor devices (for instance, see Japanese Patent Laid-Open No. 2003-138100).

However, in the conventionally usable inorganic fillers, since it has been difficult to control the refractive index to a given value, it has been difficult to retain a pattern-recognizable transmittance by the adjustment of the refractive index in a desired organic resin composition. In addition, if the content of the inorganic filler in the organic resin composition is lowered in order to retain pattern-recognizable transmittance, the thermal expansion coefficient or water absorption of the organic resin composition increases, so that a semiconductor device having sufficient thermal cycle test performance and solder resistance could not be obtained. Further, the thermal conductivity of the organic resin composition is lowered by lowering the content of the inorganic filler, thereby giving arise to such a problem that the heat radiation property of the semiconductor device is lowered.

Accordingly, an object of the present invention is to provide a resin composition for encapsulating a semiconductor device suitably usable for the flip-chip mounting, in which excellent operability is obtained, the resin composition giving excellent electric connection reliability and heat radiation property to the semiconductor device after the resin encapsulation; and a semiconductor device in which resin encapsulation is carried out with the resin composition.

These and other objects of the present invention will be apparent from the following description.

SUMMARY OF THE INVENTION

Specifically, the present invention relates to:

(1) a resin composition usable for encapsulating a semiconductor, comprising:
(A) an epoxy resin having two or more epoxy groups in one molecule;
(B) a curing agent; and
(C) inorganic composite oxide particles constituted by silicon dioxide and at least one metal oxide selected from the group consisting of oxides of metal atoms belonging to Group III and Group IV of the Periodic Table excluding silicon;

(2) a semiconductor device comprising:
a wiring circuit board,
a semiconductor element, and
a resin composition comprising:
(A) an epoxy resin having two or more epoxy groups in one molecule;
(B) a curing agent; and
(C) inorganic composite oxide particles constituted by silicon dioxide and at least one metal oxide selected from the group consisting of oxides of metal atoms belonging to Group III and Group IV of the Periodic Table excluding silicon, wherein a gap formed between the wiring circuit board and the semiconductor element is encapsulated with the resin composition; and (3) a method for manufacturing a semiconductor device comprising the steps of adhering a resin sheet comprising the resin composition of the above (1) and a stripping sheet to a semiconductor circuit side of a bump-mounting wafer, removing the stripping sheet leaving only the resin composition to the wafer, and cutting the wafer into individual chips.

According to the present invention, there is provided a resin composition for encapsulating a semiconductor device having a pattern-recognizable transmittance and at the same time excellent thermal conductivity. Also, there can be provided a semiconductor device in which the resin encapsulation is carried out with the composition, the semiconductor device having excellent electric connection reliability and heat radiation property.

Figure 1:
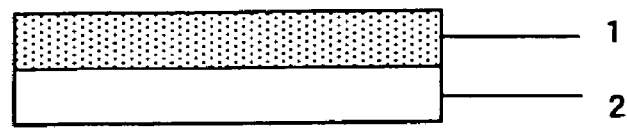
FIG. 1 is one example of a resin sheet comprising the resin composition of the present invention.

The numerals in FIGS. 1 to 6 are as follows.

1 is a resin composition for encapsulating a semiconductor device, 2 is a stripping sheet, 3 is a wafer, 4 is a bump, 5 is a dicing tape, 6 is an individual chip, and 7 is a wiring circuit board.

DETAILED DESCRIPTION OF THE INVENTION

One of the significant feature of the resin composition usable for encapsulating a semiconductor of the present invention resides in that the resin composition comprises:

(A) an epoxy resin having two or more epoxy groups in one molecule;

(B) a curing agent; and (C) inorganic composite oxide particles constituted by silicon dioxide and at least one metal oxide selected from the group consisting of oxides of metal atoms belonging to Group III and Group IV of the Periodic Table excluding silicon.

In the wafer level flip-chip mounting method, a resin for encapsulation is fed to a patterned side of a wafer, the wafer is cut into individual semiconductor elements, and the semiconductor elements are mounted on a circuit board. In the resin composition for encapsulating a semiconductor device of the present invention, since the refractive index of the inorganic filler contained in the resin composition can be arbitrarily changed, the resin composition retains a pattern-recognizable transmittance without lowering the content of the inorganic filler, and has an excellent thermal conductivity. Therefore, by providing this resin composition to the pattern side, the wafer can be easily cut into individual chips, so that a semiconductor device having excellent heat radiation property can be manufactured after the resin encapsulation.

In the present specification, each of the pair of terms "semiconductor circuit side" and "patterned side, terms "cutting" and "dicing," and terms "chips," "semiconductor chips," and "semiconductor elements" are respectively used for the same meaning.

The epoxy resin having two or more epoxy groups in one molecule contained in the resin composition of the present invention includes bisphenol A epoxy resins, bisphenol F epoxy resins, novolak epoxy resins such as phenol novolak epoxy resins and cresol novolak epoxy resins, alicyclic epoxy resins, nitrogen-containing cyclic epoxy resins such as triglycidyl isocyanurate and hydantoic epoxy resins, hydrogenated bisphenol A epoxy resins, aliphatic epoxy resins, hydrogenated bisphenol A epoxy resins, aliphatic epoxy resins, glycidyl ether epoxy resins, bisphenol S epoxy resins, biphenyl epoxy resins from which low water supply rate cured products are mainly prepared, dicyclo-ring epoxy resins, naphthalenic epoxy resins, and the like. These epoxy resins can be used alone or in admixture of two or more kinds.

The above-mentioned epoxy resin may be solid or liquid at an ambient temperature. Those epoxy resins generally having an epoxy equivalence of from 90 to 1000 g/eq are preferable, from the viewpoint of facilitation in controlling mechanical strength and glass transition temperature (Tg) of the cured product of the resin composition. The content of the epoxy resin in the resin composition is preferably from 5 to 85% by weight, more preferably from 10 to 80% by weight, from the viewpoints of improvements in thermal resistance and moisture tolerance. In addition, those epoxy resins having a melt viscosity of 0.5 Pa·s or less at 150° C. are preferable from the viewpoint of improvement in electric connection.

The curing agent contained in the resin composition of the present invention is not particularly limited, as long as the agents function as a curing agent for above-mentioned epoxy resin, and various curing agents can be used. The phenolic curing agent is generally used from the viewpoint of having excellent moisture tolerance reliability, and various acid anhydride-based curing agents, aromatic amines, dicyandiamide, hydrazide, benzoxazine cyclic compounds and the like can be also used. These curing agents can be used alone or in admixture of two or more kinds.

The phenolic curing agent includes, for instance, cresol novolak resins, phenol novolak resins, phenolic resins containing dicyclopentadiene ring, phenol aralkyl resins, naphthol, xylylenic phenol resins, and the like. These phenolic curing agents can be used alone or in admixture of two or more kinds.

It is preferable that the composition ratio of the epoxy resin and the curing agent mentioned above is such that when the phenolic curing agent is used as a curing agent, the reactive hydroxyl group equivalent in the phenolic curing agent is usually at a ratio of preferably from 0.5 to 1.5 g/eq, more preferably from 0.7 to 1.2 g/eq, per 1 g/eq of the epoxy equivalence in the epoxy resin, from the viewpoint of securing curability, thermal resistance and moisture tolerance. Incidentally, even in a case where a curing agent other than the phenolic curing agent is used, the composition ratio is in accordance with the composition ratio (equivalence ratio) as in the case where the phenolic curing agent is used. In addition, those curing agents having a melt viscosity of 0.5 Pa·s or less at 150° C. are preferable from the viewpoint of improvement in electric connection.

The inorganic composite oxide particles contained in the resin composition of the present invention include those particles constituted by silicon dioxide and at least one metal oxide selected from the group consisting of oxides of metal atoms belonging to Group III and Group IV of the Periodic Table excluding silicon, wherein the metal oxide and silicon dioxide are chemically bonded to each other in a physically inseparable state.

The above-mentioned metal oxide includes, for instance, oxides of metal atoms belonging to Group III of the Periodic Table, such as boron oxide, aluminum oxide, gallium oxide, scandium oxide, yttrium oxide, lanthanum oxide, and cerium oxide; and oxides of metal atoms belonging to Group IV of the Periodic Table such as titanium oxide, zirconium oxide, hafnium oxide, germanium oxide, tin oxide, and lead oxide, and titanium oxide can be preferably used.

The content of silicon dioxide in the inorganic composite oxide particles is preferably from 50 to 99% by mol, more preferably from 65 to 98% by mol, especially preferably from 70 to 95% by mol, from the viewpoint of securing the desired refractive index of the resulting resin composition. When the content of silicon dioxide is within the above range, it basically covers a range of refractive indices of the generally usable resin composition of from 1.4 to 1.7.

Here, the refractive index as used herein can be determined with Abbe refractometer at room temperature.

A total content of the metal oxide and silicon dioxide in the inorganic composite oxide particles is preferably at least 80% by mol, more preferably at least 90% by mol, from the viewpoint of securing refractive index. In addition, other components such as an alkali metal oxide or an alkaline earth metal oxide may be contained in the inorganic composite oxide particles in an amount so long as the exhibition of the desired effects is not suppressed.

The content of the inorganic composite oxide particles in the resin composition is preferably from 10 to 85% by weight, more preferably from 20 to 80% by weight, from the viewpoints of controlling viscosity of the resin composition and securing electric connection reliability between the semiconductor element and the wiring circuit board.

When the average particle size of the inorganic composite oxide particles is determined by, for instance, laser diffraction scattering method (commercially available from HORIBA Ltd., trade name: LA-910), the average particle size is preferably from 0.1 to 1.5 μm, more preferably from 0.3 to 1.2 μm, from the viewpoint of securing electric connection reliability, resin dispersibility and transmittance.

The term "transmittance" as used herein is not particularly limited as long as the transmittance is a pattern-recognizable level. The transmittance, for instance, refers to the transmittance as determined by a spectrophotometer (commercially available from Shimadzu Corporation, trade name: UV3101) at a wavelength of 650 nm, and those having transmittance of 30% or more are sufficient.

The inorganic composite oxide particles usable in the present invention can be prepared by, for instance, a conventionally known sol-gel method, and commercially available ones can be also used.

In addition, the resin composition of the present invention may contain other components as mentioned below as desired.

For instance, a thermoplastic resin can be added to the resin composition of the present invention as desired. The thermoplastic resin includes, for instance, alkyl acrylate copolymers, acrylonitrile-butadiene copolymers, hydrogenated acrylonitrile-butadiene copolymers, styrene-butadiene-styrene copolymers, epoxy-modified styrene-butadiene-styrene copolymers, and the like. The content of the thermoplastic resin in the resin composition is not particularly limited as long as the resin composition can be formed into a sheet. The content of the thermoplastic resin in the resin composition is preferably from 1 to 50% by weight, more preferably from 3 to 30% by weight, from the viewpoint of securing adhering property to the wafer, cutting workability and chip-mounting property. These thermoplastic resins can be used alone or in admixture of two or more kinds.

Furthermore, a curing accelerator can be added to the resin composition of the present invention as desired. The curing accelerator includes, for instance, amine adduct-based curing accelerators, phosphorus-containing curing accelerators, phosphorus-boron-containing curing accelerators, and the like. In addition, a microcapsulated curing accelerator in which the curing accelerator is enveloped in a microcapsule (see, for instance, Japanese Patent Laid-Open No. 2000-309682) is more preferably used. These curing accelerators can be used alone or in admixture of two or more kinds.

The content of the curing accelerator in the resin composition may be appropriately set in a ratio so that the desired curing rate is obtained and that soldering property and adhesiveness are not decreased. The setting method includes, for instance, a method comprising measuring the gelation time (index for curing rate) on a hot plate of the resin composition containing a curing accelerator in various amounts, whereby the amount at which the desired gelation time is obtained is defined as its content. In general, the content of the curing accelerator is preferably from 0.1 to 40 parts by weight, more preferably from 1 to 20 parts by weight, based on 100 parts by weight of the curing agent.

In addition, there may be added to the resin composition a silane coupling agent such as epoxy silane, a titanium coupling agent, a surface-modifying agent, an antioxidant, a tackifying agent, silicone oil, a silicone rubber-reactive or synthetic rubber-reactive diluent or the like from the viewpoint of lowering stress, or there may be added thereto ion trapping agents such as hydrotalcites and bismuth hydroxide from the viewpoint of improving moisture tolerance reliability. These optional additives can be used alone or in admixture of two or more kinds. The content of these additives can be properly adjusted within the range so as to obtain the desired effects of each additive.

The resin composition of the present invention can be, for instance, prepared as follows. The resin composition is usually formed as a sheet-like composition on a stripping sheet (for instance, a polyester film) in consideration of its convenience of use. Specifically, an epoxy resin, a curing agent, and inorganic composite oxide particles, and optional other components is blended in a given amount, and the mixture obtained is mixed and dissolved in an organic solvent such as toluene, methyl ethyl ketone or ethyl acetate, and this mixed solution is applied to a given stripping sheet (for instance, a polyester film). Next, the sheet is subjected to a drying step at a temperature of from about 80° to about 160° C., and thereafter the organic solvent is removed, thereby preparing a sheet-like resin composition on the stripping sheet. Alternatively, an epoxy resin, a curing agent, and inorganic composite oxide particles, and optional other components is blended in a given amount, and the mixture obtained is mixed and dissolved in an organic solvent such as toluene, methyl ethyl ketone or ethyl acetate, and this mixed solution is applied to a substrate film such as a polyester film subjected to a releasing treatment (for instance, silicon treatment). Next, this applied substrate film is subjected to a drying step at a temperature of from about 80° to about 160° C., thereby preparing the sheet-like resin composition on the substrate film. Thereafter, the sheet-like resin composition on the substrate film is adhered to the given stripping sheet using a roll laminater, and only the substrate film is removed from the sheet, whereby preparing a sheet-like resin composition on the stripping sheet.

As described above, the resin composition of the present invention is obtained. One example of the resin sheet made from the resin composition and the stripping sheet is shown in FIG. 1. In the figure, a resin composition 1 is laminated on a stripping sheet 2.

Next, the method for manufacturing a semiconductor device of the present invention will be described. The method for manufacturing a semiconductor device of the present invention comprises the steps of adhering a resin sheet containing the resin composition of the present invention to the semiconductor circuit side, optionally grinding a backside of a bump-mounting wafer to which the resin sheet is adhered, removing (stripping) a stripping sheet leaving only the resin composition to the wafer, and cutting the wafer into individual chips. FIGS. 2 to 6 each shows one example of each step in the method for manufacturing a semiconductor device of the present invention. The method for manufacturing a semiconductor device of the present invention will be explained hereinbelow by referring to these drawings.

Figure 2:
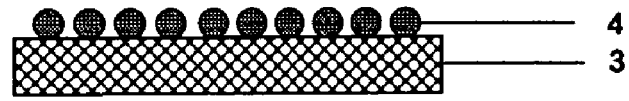
FIG. 2 is one example of a cross-sectional view of a bump-mounting wafer.

One example of the bump-mounting wafer is shown in FIG. 2, wherein a bump 4 is formed on a wafer 3.

The materials of the wafer 3 usable in the present invention include, but not particularly limited to, silicon, gallium-arsenic and the like.

The bump 4 includes, for instance, but not particularly limited to, low-melting point and high-melting point bumps obtained by soldering, tin bumps, silver-tin bumps, silver-tin-copper bumps, gold bumps, copper bumps and the like.

Figure 3:
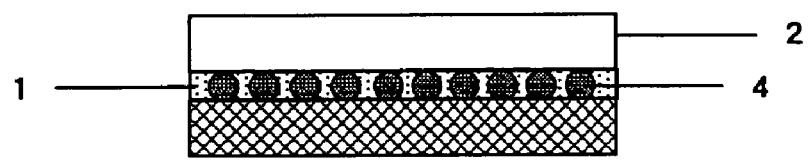
FIG. 3 is one example of an explanatory view of a step of the method for manufacturing a semiconductor device of the present invention.

One example in which the resin sheet (illustrated in FIG. 1) is adhered to the circuit side of the semiconductor device of the above-mentioned wafer 3 is shown in FIG. 3, wherein the circuit side of the wafer 3 and the resin composition 1 are contacted with each other, and the bump 4 is embedded in the resin composition 1.

In the adhesion of the resin sheet to the above-mentioned wafer 3, the roller-type adhering device and a vacuum-type adhering device is used. The adhering temperature is preferably from 25° to 100° C., more preferably from 40° to 80° C., from the viewpoints of reduction of voids, improvement in close contact of the wafer, and prevention of bowing of the wafer after grinding. In addition, the adhering pressure is appropriately set depending upon the adhering method, the adhering time and the like.

The wafer to which the above-mentioned resin sheet is adhered may be subjected to grinding to obtain the desired thickness. In the grinding of the wafer, the grinding device having a grinding stage is used without particular limitation. The grinding device includes a known device such as "DFG-840" commercially available from DISCO K.K. Also, the grinding conditions are not particularly limited.

Figure 4:
FIG. 4 is one example of an explanatory view of a step of the method for manufacturing a semiconductor device of the present invention.

One example where a dicing tape is adhered to a backside of the wafer after grinding (grinding side) is shown in FIG. 4, wherein only a stripping sheet 2 is removed from the resin sheet, and a dicing tape 5 is adhered to a backside of the wafer 3.

The removal of the stripping sheet is carried out by using, for instance, "HR-8500-II" commercially available from Nitto Denko Co., Ltd.

The dicing tape usable in the present invention is not particularly limited, as long as the dicing tape is one which is usually used in the field of art.

The adhering device for the dicing tape and conditions are not particularly limited, and known devices and conditions can be employed.

Figure 5:
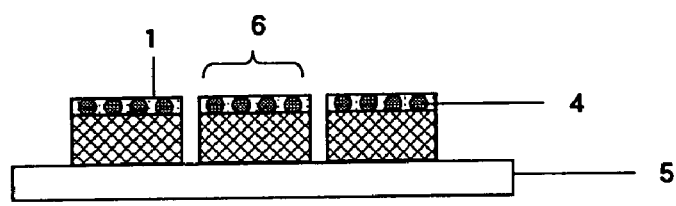
FIG. 5 is one example of an explanatory view of a step of the method for manufacturing a semiconductor device of the present invention.

One example after cutting (dicing) of the wafer is shown in FIG. 5, wherein the wafer 3 to which the resin composition 1 is adhered is cut into individual chips 6 with keeping the wafer 3 adhered to the dicing tape 5.

The cutting of the wafer is not particularly limited, and cutting is carried out with an ordinary dicing device.

Figure 6:
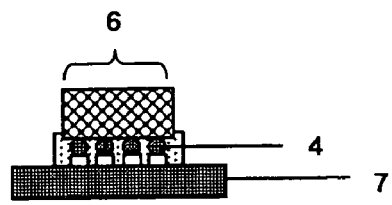
FIG. 6 is one example of an explanatory view of a step of the method for manufacturing a semiconductor device of the present invention.

One example of the method for mounting the chips is shown in FIG. 6, wherein the individual chips 6 are removed from the dicing tape, and mounted on a wiring circuit board 7. The gap formed between the wafer 3 and the wiring circuit board 7 is resin-encapsulated by the resin composition.

The wiring circuit board 7 is not particularly limited, and roughly classified into ceramic boards and plastic boards. The plastic board includes, for instance, epoxy board, bismaleimidotriazine board, polyimide board, and the like.

The method for mounting individual chips 6 on a wiring circuit board 7 includes a method comprising firstly picking up and removing the individual chips 6 from a dicing tape 5, and housing the individual chips in a chip tray or conveying the individual chips 6 to a chip-mounting nozzle of a flip-chip bonder; and thereafter (i) obtaining electric connection at the same time as mounting the individual chips 6 to the wiring circuit board 7, while pressing with heating in a bump-bonding form (heat-and-pressure mounting method); (ii) obtaining an electric connection at the same time as mounting the individual chips 6 to a wiring circuit board 7 using heat, pressure and ultrasonication; (iii) mounting the individual chips 6 to a wiring circuit board 7, and thereafter obtaining electric connection by solder reflow; and the like.

The above-mentioned heating temperature is preferably 500° C. or lower, more preferably 400° C. or lower, from the viewpoint of preventing deterioration of the individual chips 6 and the wiring circuit board 7. The lower limit of the heating temperature is about 100° C. Although the above-mentioned pressure conditions depend on the number of connecting electrodes or the like, the pressure is preferably from $9.8 \times 10^{-3}$ to 1.96 N/chip, more preferably from $1.96 \times 10^{-2}$ to $9.8 \times 10^{-1}$ N/chip.

According to the above method, a semiconductor device having excellent electric connection reliability and durability can be efficiently obtained. The semiconductor device obtained is encompassed in the present invention.

EXAMPLES

The present invention will be described more specifically hereinbelow by means of Examples, without intending to limit the present invention thereto.

The raw materials and parts used in Examples and Comparative Examples are collectively shown hereinbelow.

In the preparation of the resin composition, there were used a naphthalenic epoxy resin (epoxy equivalence: 141 g/eq., viscosity: 560 mPa·s at 50° C.) as an epoxy resin, a xylylenic phenolic resin (hydroxyl equivalence: 171 g/eq., viscosity: 40 mPa·s at 150° C.) as a curing agent, a microcapsulated triphenylphosphine (shell: polyurea, core/shell ratio: 50/50 wt %) as a curing accelerator, an alkyl acrylate copolymer (Moonie viscosity: 52.5 ML1+4/100° C.) as a thermoplastic resin, an epoxysilane (commercially available from Shin-Etsu Chemical Co., Ltd., trade name: KBM-403) as a silane coupling agent, and (a) titanium oxide-modified silicon dioxide (D25=1.53, average particle size: 0.5 μm, commercially available from Tokuyama Corporation, trade name: ST-600), (b) titanium oxide-modified silicon dioxide (D25=1.54, average particle size: 0.5 μm, commercially available from Tokuyama Corporation, trade name: ST-601), (c) titanium oxide-modified silicon dioxide (D25=1.55, average particle size: 0.5 μm, commercially available from Tokuyama Corporation, trade name: ST-3-743), (d) titanium oxide-modified silicon dioxide (D25=1.56, average particle size: 0.5 μm, commercially available from Tokuyama Corporation, trade name: ST-617), or (e) silicon dioxide (D25=1.46, average particle size: 0.5 μm, commercially available from NIPPON SHOKUBAI CO., LTD.) as inorganic composite oxide particles.

Here, "D25" refers to a refractive index determined by Abbe refractometer at 25° C.

The evaluation methods for Examples and Comparative Examples are summarized hereinbelow.

(1) Transmittance

Transmittance of the resin composition was determined with a spectrophotometer (commercially available from Shimadzu Corporation, trade name: UV3101) at a wavelength of 650 nm. Here, the case where the transmittance is 30% or more was evaluated as "pattern-recognizable."

(2) Thermal Conductivity

A molded product of 80 mm×50 mm×20 mm made of the resin composition was prepared, and the thermal conductivity of the resin composition was determined with QTM-D3 commercially available from KYOTO ELECTRONICS MANUFACTURING CO., LTD.

(3) Thermal Cycle Test

A procedure of keeping the semiconductor device at −55° C. for 10 minutes, and thereafter keeping the semiconductor device at 125° C. for 10 minutes was carried out. After this procedure was carried out for 500 times (TST 500) or 1000 times (TST 1000), the electric resistance of the semiconductor device was determined with a daisy chain (commercially available from ADVANTEST, trade name: DIGITAL MULTIMETER TR6847). The obtained electric resistance was compared to the initial value (electric resistance of the semiconductor device before carrying out the above-mentioned procedure). Those semiconductor devices of which electric resistances are twice or more of the initial value were counted as defective products.

Examples 1 to 4 and Comparative Examples 1 and 2

The resin compositions of Examples 1 to 4 and Comparative Examples 1 and 2 were prepared as follows.

Each of the raw materials shown in Table 1 was dissolved in methyl ethyl ketone while mixing in a ratio shown in the same table, and this mixed solution was applied to a polyester film subjected to a releasing treatment. Next, the solution on the polyester film was dried at 120° C. for 5 minutes to remove methyl ethyl ketone, thereby forming a resin composition having a desired thickness of 50 μm on the above-mentioned polyester film. The properties of the resin composition were determined.

TABLE 1

| Raw Materials (Parts by weight) | Ex. No. | | | | Comp. Ex. No. | |
| --- | --- | --- | --- | --- | --- | --- |
| | 1 | 2 | 3 | 4 | 1 | 2 |
| Epoxy Resin | 9.4 | 9.4 | 9.4 | 9.4 | 9.4 | 9.4 |
| Curing Agent | 11.6 | 11.6 | 11.6 | 11.6 | 11.6 | 11.6 |
| Thermoplastic Resin | 3 | 3 | 3 | 3 | 3 | 3 |
| Curing Accelerator | 1 | 1 | 1 | 1 | 1 | 1 |
| Silane Coupling Agent | 0.125 | 0.125 | 0.125 | 0.125 | 0.125 | 0.125 |
| Inorganic Composite Oxide Particles (a) | 24.9 | — | — | — | — | — |
| Inorganic Composite Oxide Particles (b) | — | 24.9 | — | — | — | — |
| Inorganic Composite Oxide Particles (c) | — | — | 24.9 | — | — | — |
| Inorganic Composite Oxide Particles (d) | — | — | — | 24.9 | — | — |
| Inorganic Composite Oxide Particles (e) | — | — | — | — | — | 24.9 |

The resin composition prepared above was adhered to ethyl vinyl acetate (stripping sheet) at 60° C., to form a resin sheet. This resin sheet was adhered to a circuit board side of the bump-mounting wafer with a roller adhering apparatus (commercially available from Nitto Denko Co., Ltd., trade name: DR-8500-II) at 70° C. A dicing tape (commercially available from Nitto Denko Co., Ltd., trade name: DU-300) was adhered to the wafer obtained. Next, the stripping sheet was removed, and thereafter the wafer obtained was cut into individual chips with a dicing apparatus (commercially available from DISCO, trade name: DFD-651), to give a chip with the resin composition.

Thereafter, semiconductor devices were produced by mounting chips with the resin composition to a wiring circuit board using a flip chip bonder (commercially available from Kyusyu Matsushita, trade name: FB30T-M) according to heat-and-pressure mounting method (during mounting chips: temperature=120° C., pressure=9.8×10$^{-2}$ N/chip, time=3 seconds; during actual pressing: temperature=240° C., pressure=4.9×10$^{-1}$ N/chip, time=10 seconds), and carrying out resin encapsulation. The semiconductor devices obtained were subjected to post-curing of the resin composition using a drying furnace (commercially available from ESPEC Corp., trade name: PHH-100) at 150° C. for 60 minutes, to give a desired semiconductor device. The above evaluations were made on the semiconductor devices produced. The results are shown in Table 2.

TABLE 2

| | Ex. No. | | | | Comp. Ex. No. | |
| --- | --- | --- | --- | --- | --- | --- |
| | 1 | 2 | 3 | 4 | 1 | 2 |
| Properties of Resin Composition | | | | | | |
| Transmittance (%) at 650 nm | 30.2 | 42.7 | 57.2 | 67 | 91.3 | 5.0 |
| Thermal Conductivity (W/m · K) | 0.41 | 0.42 | 0.42 | 0.43 | 0.19 | 0.38 |
| Properties of Semiconductor Device | | | | | | |
| Number of Defective Products after TST500 | 0/10 | 0/10 | 0/10 | 0/10 | 10/10 | Not Testable |
| Number of Defective Products after TST1000 | 0/10 | 0/10 | 0/10 | 0/10 | 10/10 | Not Testable |

It can be seen from the results of Table 2 that the semiconductor devices produced in Examples 1 to 4 have pattern-recognizable transmittance and high thermal conductivity, so that no defective products are generated at TST500 cycles and TST1000 cycles of the thermal cycle test.

On the other hand, the semiconductor device produced in Comparative Example 1 had a low thermal conductivity even though its transmittance was high, and defective products were generated in all the semiconductor devices in TST500 cycles of the thermal cycle test. Since the semiconductor device produced in Comparative Example 2 had a low transmittance, its patterns could not be recognized, so that a desired semiconductor element could not be obtained. Therefore, it can be seen that the semiconductor devices produced in Examples have pattern-recognizable transmittance and high thermal conductivity, as compared to the semiconductor devices produced in Comparative Examples, so that a stable electric resistance is guaranteed, i.e. electric connectivity is excellent, for the TST test.

According to the present invention, there is provided a resin composition for encapsulating a semiconductor having a pattern-recognizable transmittance and at the same time excellent thermal conductivity. Also, there can be manufactured a semiconductor device in which the resin encapsulation is carried out with the composition, the semiconductor device having excellent electric connection reliability and heat radiation property.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    a wiring circuit board,
    a semiconductor element, and
    a resin composition comprising:
    (A) an epoxy resin having two or more epoxy groups in one molecule;
    (B) a curing agent; and
    (C) inorganic composite oxide particles constituted by silicon dioxide and at least one metal oxide selected from the group consisting of oxides of metal atoms belonging to Group III and Group IV of the Periodic Table excluding silicon,
    wherein said resin composition has a pattern-recognizable transmittance of from 30 to 67% at 650 nm,
    and wherein said semiconductor device is produced in a flip-chip mounting method and a gap formed between the wiring circuit board and the semiconductor element is encapsulated with the resin composition.

2. The semiconductor device according to claim 1, wherein said metal oxide is titanium oxide.

3. The semiconductor device according to claim 1, wherein said inorganic composite oxide particles have an average particle size of from 0.1 to 1.5 µm, 10.

4. The semiconductor device according to claim 1, wherein said inorganic composite oxide particles are contained in an amount of from 10 to 85% by weight of the resin composition.

5. The semiconductor device according to claim 1, wherein the resin composition is a sheet-like resin composition.

6. A method for manufacturing a semiconductor device comprising the steps of adhering a resin sheet comprising:
    a resin composition usable for encapsulating a semiconductor, comprising:
    (A) an epoxy resin having two or more epoxy groups in one molecule;
    (B) a curing agent; and
    (C) inorganic composite oxide particles constituted by silicon dioxide and at least one metal oxide selected from the group consisting of oxides of metal atoms belonging to Group III and Group IV of the Periodic Table excluding silicon,
    and a stripping sheet to a semiconductor circuit side of a bump-mounting wafer, removing the stripping sheet leaving only the resin composition to the wafer, and cutting the wafer into individual chips.

7. The method according to claim 6, wherein said metal oxide is titanium oxide.

8. The method according to claim 6, wherein said inorganic composite oxide particles have an average particles size of from 0.1 to 1.5 µm.

9. The method according to claim 6, wherein said inorganic composite oxide particles are contained in an amount of from 10 to 85% by weight of the resin composition.

10. The method according to claim 6, wherein the resin composition is a sheet-like resin composition.

11. The method according to claim 6, further comprising the step of grinding a backside of the bump-mounting wafer to which the resin sheet is adhered.

* * * * *